United States Patent
Chi

[11] Patent Number: 6,133,604
[45] Date of Patent: Oct. 17, 2000

[54] NOR ARRAY ARCHITECTURE AND OPERATION METHODS FOR ETOX CELLS CAPABLE OF FULL EEPROM FUNCTIONS

[75] Inventor: Min-hwa Chi, Hsinchu, Taiwan

[73] Assignee: Taiwan Semiconductor Manufacturing Corporation, Hsinchu, Taiwan

[21] Appl. No.: 09/295,017

[22] Filed: Apr. 20, 1999

[51] Int. Cl.[7] ................................................. H01L 29/00
[52] U.S. Cl. ............................................................. 257/315
[58] Field of Search ............................................. 257/315

[56] References Cited

U.S. PATENT DOCUMENTS

5,850,091  12/1998  Li et al. .

*Primary Examiner*—Stephen D. Meier
*Attorney, Agent, or Firm*—Blakely, Sokoloff, Taylor & Zafman LLP

[57] ABSTRACT

A NOR array architecture allowing single bit, row, and column programming and erase operations is disclosed. The NOR array architecture comprises: a plurality of ETOX cells formed in a deep n-well, each of the ETOX cell having: (1) a control gate; (2) a floating gate insulated from and formed substantially underneath the control gate; (3) a p-well formed in the n-well and underneath the floating gate and the control gate; (4) a drain implant formed in the p-well adjacent to the floating gate; and (5) a source implant formed in the p-well adjacent to the floating gate. The ETOX cells are formed into a two-dimensional array including a plurality of rows and a plurality of columns. Each of the control gates of the ETOX cells in adjacent two rows sharing a common row are connected to a row wordline. Each of the source implants of the ETOX cells sharing a common row are connected to a row sourceline. Each of the drain implants of the ETOX cells sharing a common column are connected to a column bitline. Finally, each of the p-wells of the ETOX cells in a common column are connected together to a common p-well bias line.

11 Claims, 8 Drawing Sheets

NOR ARRAY ARCHITECTURE AND OPERATION METHODS FOR ETOX CELLS CAPABLE OF FULL EEPROM FUNCTIONS

FIELD OF THE INVENTION

The present invention relates to ETOX flash memory formed in triple wells, and more particularly, to a NOR array using ETOX cells using substrate hot-electron (SHE) injection.

BACKGROUND OF THE INVENTION

The stack-gate ETOX cell, one of the most popular cell structures for flash memories, is widely programmed by channel hot-electron (CHE) and erased by Fowler-Nordheim (FN) tunneling through the source side or the channel area.

Figure 1:
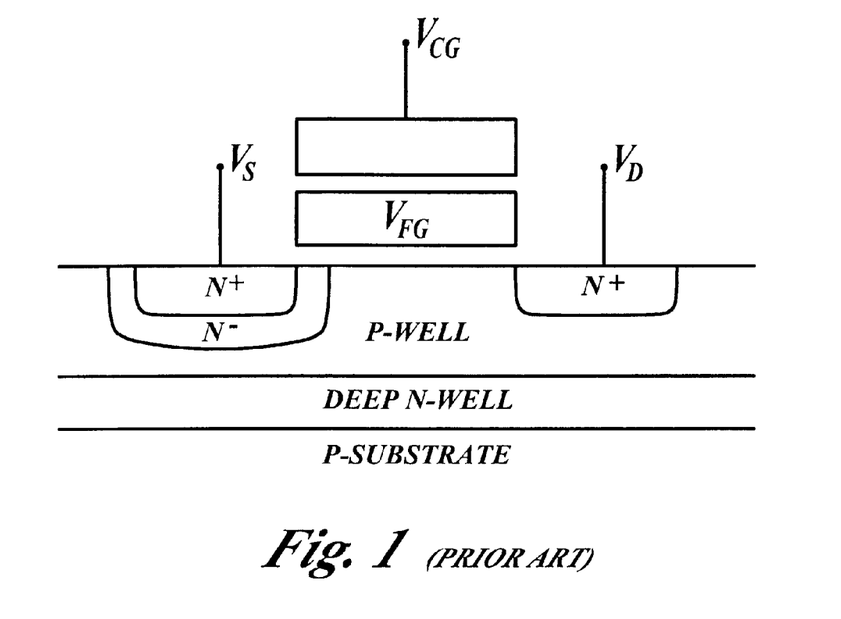
FIG. 1 is a schematic diagram of a prior art ETOX cell formed by a triple-well process.

The n-channel ETOX cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the positive power supply (Vcc) and the p-well is biased to ground (Vss). The n+source is typically doubly implanted by $As^{75}$ (with a high dose of ~1E16/cm$^2$) and $P^{31}$ (with a lower dose of ~1E14/cm$^2$) so that the source junction is a graded junction and can be biased at high voltage (e.g. ~12 v) during erase operation. The n+ drain is typically implanted by As only with a high dose (~1E16/cm$^2$) and the drain side does not need the lightly-doped-drain (LDD) implant and spacer structure.

Note that the LDD structure is not useful in an ETOX cell, although it is important in normal CMOS transistors for reducing electrical field during switching for lower hot-electron generation. The tunnel oxide ($T_{ox}$) is typically 80–120 angstroms thick, the inter-poly dielectric ($T_{pp}$) typically consists of thin nitride-oxide (ONO) layers. As an example, a typical ETOX cell based on a 0.35 um CMOS design rule has the following cell parameters: $T_{ox}$~90 angstroms, $T_{pp}$~160 angstroms (oxide equivalent thickness), and control-gate to floating-gate coupling ratio of ~0.8.

The ETOX cell of FIG. 1 is typically programmed by channel-hot-electrons (CHE). Notations for biases at all nodes are defined in FIG. 1. The bias for programming is typically: $V_d$~7 v, $V_{cg}$~+9 to +12 v, and $V_s$=0 v. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is typically erased by Fowler-Nordheim (F-N) tunneling through the source side or the channel area. The bias during source side erase is typically: $V_d$~0 v or floating, $V_{cg}$~−5 v to 0 v, and $V_s$=+9 to +12 v. This establishes a large electrical field (~10 Mv/cm) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d$~floating, $V_{cg}$~15 v, $V_{pw}$~0 v. A large electrical field (~10 Mv/cm) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high field during erase.

The bias for read operation of prior art ETOX cell is typically: $V_d$~1 v to 2 v, $V_{cg}$~$V_{cc}$, $V_s$~0 v, $V_{pw}$~0 v, $V_{dnw}$=$V_{cc}$, and $V_{sub}$~0 v. $V_{cc}$ is 3.3 v for 0.35 micron CMOS technology, and is 2.5 v for 0.25 micron CMOS technology. The channel may be inverted or not depending on the net electron charge stored on the floating-gate, and results in the on and off of the cell as measured by the read current $I_{read}$ representing the digital information of "1" or "0" stored in the cell.

Figure 2:
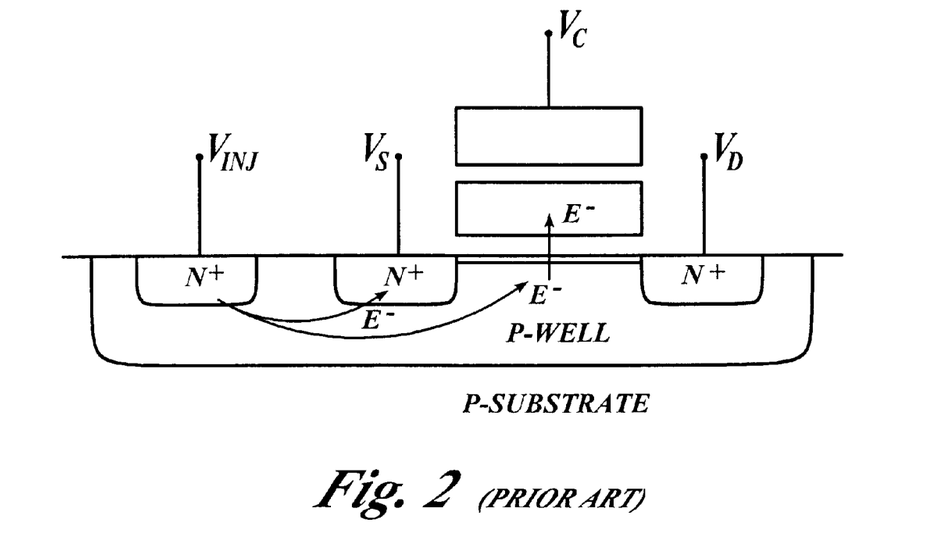
FIG. 2 is a schematic diagram of a prior art NOR array using the ETOX cells of FIG. 1.

A conventional NOR array is shown in FIG. 2, where the nodes of each ETOX cell can be accessed randomly. The drain of an ETOX cell is connected to a column (bit-line) through a contact and metal line. The control gate of the ETOX cell is connected to a row (word-line). The source of adjacent ETOX cells are connected together by n+diffusion regions (row) and is shared by an adjacent row. The source line of the entire array is shorted together through additional metal lines.

The entire array is formed in a large p-well biased at $V_{ss}$ if fabricated with a triple-well front end. Notice that the potential of a column is high (e.g., Vcc) if all word-lines are biased low (i.e., all cells in a column are not selected and not turned "on"). This is similar to the NOR logic function with the column bias as output node and the word-lines as input nodes. For this reason, this type of array is widely referred to as the NOR type.

The present invention provides a new NOR array architecture that uses ETOX cells that utilize substrate hot-electron programming. The new architecture allows each ETOX cell to be separately and individually programmed, as well as row or column programming. This type of SHE programming is impossible for the conventional NOR array shown in FIG. 2. The new array architecture also allows single cells to be erased as well as row or column erase. Therefore, the new array architecture can result in ETOX cell performing full EEPROM functions.

SUMMARY OF THE INVENTION

A NOR array architecture allowing single bit, row, and column programming and erase is disclosed. The NOR array architecture comprises: a plurality of ETOX cells formed in a deep n-well, each of said ETOX cell having: (1) a control gate; (2) a floating gate insulated from and formed substantially underneath said control gate; (3) a p-well formed in said n-well and underneath said floating gate and said control gate; (4) a drain implant formed in said p-well adjacent to said floating gate; and (5) a source implant formed in said p-well adjacent to said floating gate. The ETOX cells are formed into a two-dimensional array including a plurality of rows and a plurality of columns. Each of the control gates of said ETOX cells sharing a common row are connected to a row wordline. Each of the source implants of said ETOX cells sharing a common row are connected to a row sourceline. Each of the drain implants of said ETOX cells sharing a common column are connected to a column bitline. Finally, each of the p-wells of said ETOX cells in a column are connected together to a common p-well bias line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a NOR array architecture that takes advantage of ETOX cells that utilize substrate hot electron programming. In the preferred embodiment, the ETOX cells are programmed in accordance with a novel technique as described below. Once the programming method is described, the new NOR array architecture of the present invention will be described.

Figure 3:
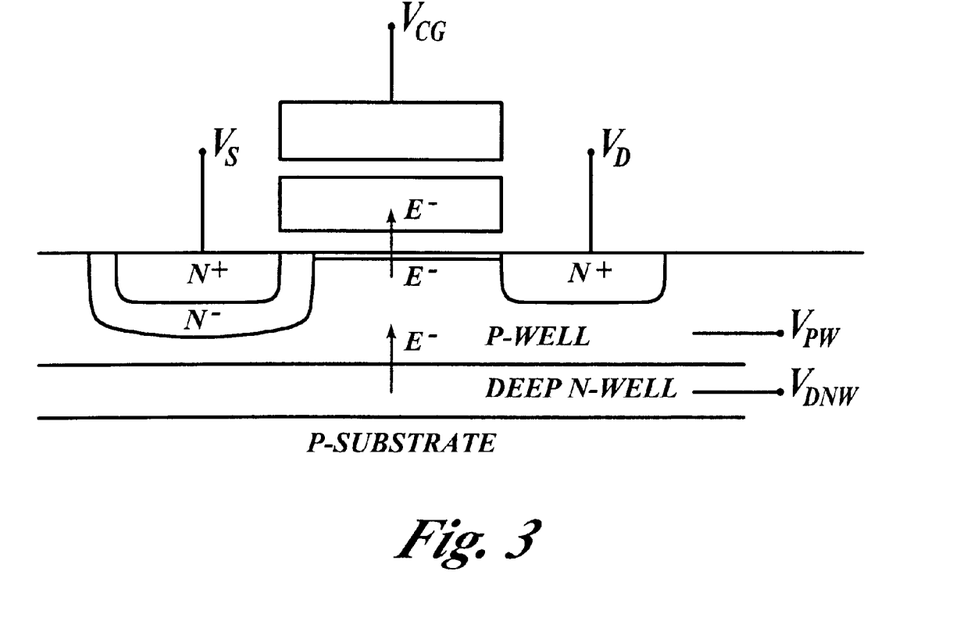
FIG. 3 is a schematic diagram of a triple-well ETOX cell during programming in accordance with the present invention.

The structure of a stack-gate ETOX cell in a triple-well is shown in FIG. 3. For an ETOX cell based on 0.35 um design rule, the following parameters are preferred: $T_{ox}$=95 A, $T_{ono}$=160 A, $\gamma_g$=0.75, W=0.6 um, L=0.6 um. $\gamma_g$ is the coupling ratio between the control gate and the floating gate.

The substrate hot electron (SHE) programming method of the present invention is qualitatively described first. The forward-biased deep n-well to p-well junction provides "seed" electrons (e.g. <1 uA/cell injecting and diffusing into the p-well. Preferably, the $V_{dnw}$=0 V and $V_{pw}$=0.5 volts. The control-gate is biased high enough (e.g., ~10 v–13 v) so that the channel is inverted. The source and drain junctions are biased high enough (e.g., 5 v to 7 v) for accelerating (or heating up) those "seed" electrons toward the channel area and finally injecting the electrons onto the floating-gate. The control-gate potential ($V_{cg}$) establishes a field across the tunnel oxide for assisting hot electrons to inject toward the floating-gate.

Figure 4:
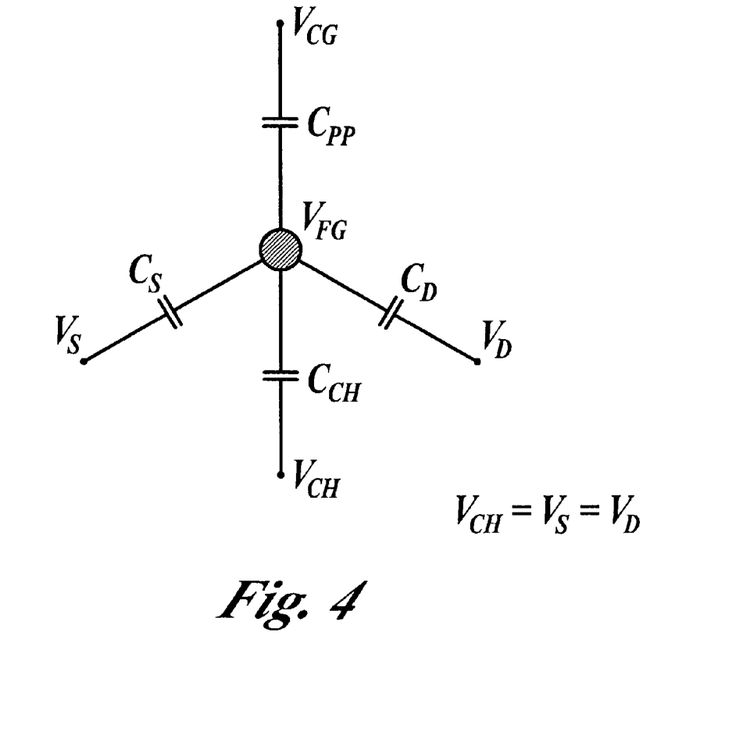
FIG. 4 is a schematic diagram of a lumped capacitor model of the ETOX cell of FIG. 3.

A simple analysis of SHE programming on ETOX cells is described here based on a lumped capacitor model of the ETOX cell shown in FIG. 4. The $V_{cg}$ can be estimated from charge conservation, $$C_{pp}(V_{fg}-V_{cg})+(C_s+C_d)(V_{fg}-V_d)+C_{ch}(V_{fg}-V_d)=Q_f \quad (1)$$

Let $C_t=C_{pp}+C_s+C_d+C_{ch}$. The coupling ratios are defined as: $\gamma_g=C_{pp}/C_t$; $\gamma_d=C_d/C_t$; $\gamma_s=C_s/C_t$; $\gamma_{ch}=C_{ch}/C_t$; and $\gamma_g+\gamma_d+\gamma_s+\gamma_{ch}=1$. The programming bias conduction for a 0.35 um ETOX cell is: $V_{cg}$=10 v to 13 v and $V_d$=$V_s$=5 v to 7 v. The p-well is grounded for convenience. $V_{fg}$ is high enough, i.e., $V_{fg}>V_t$ (at bias of $V_d$) for channel inversion. The $V_{fg}$ during programming is from Eq. (1), $$V_{fg}=Q_f/C_t+V_{cg}\gamma_g+V_d(\gamma_d+\gamma_s+\gamma_{ch})=Q_f/C_t+V_{cg}\gamma_g+V_d(1-\gamma_g) \quad (2)$$

During measurement of cell threshold voltage (i.e., $V_t$~$V_{to}/\gamma_g$), where $V_{to}$ is the threshold voltage viewed from the floating-gate: $V_d$~0.1 v, $V_s$=0, $V_{ch}$~0, $V_{cg}$=$V_t$, $V_{fg}$=$V_{to}$, from Eq. (2), $$V_{to}=Q_f/C_t+(V_t-0.1)\gamma_g+0.1 \cong Q_f/C_t+V_t\gamma_g \quad (3)$$

At the beginning of programming, $Q_f$~0, thus $V_t \cong V_{to}/\gamma_g$. As programming continues, $|Q_f|$ increases (i.e. more negative electron charge), and $V_{fg}$ decreases, until the $V_{fg}$ approaches a value of $V_d+V_{to@Vd}$ (i.e. the threshold-voltage viewed from floating-gate at body-bias of $V_d$), when the inversion is about to disappear. $V_{to@Vd}$~$V_{to}+\eta V_d$; where $\eta$ is the coefficient of the body-bias effect. Typically, $\eta$~0.15. When the inversion layer is about to disappear, the programming process becomes slow and almost stops; the $V_{fg}$ stays constant, and $Q_f$ saturates (also $V_t$ saturates). Thus, from Eq. (2) and Eq. (3), $$V_t\gamma_g \cong V_{to} - Q_f/C_t \quad (4)$$
$$\cong (V_{to} - V_d - V_{to(@Vd)}) + V_{cg}\gamma_g + V_d(1-\gamma_g)$$
$$\cong V_{cg}\gamma_g - V_d(\gamma_g + \eta)$$

Figure 5:
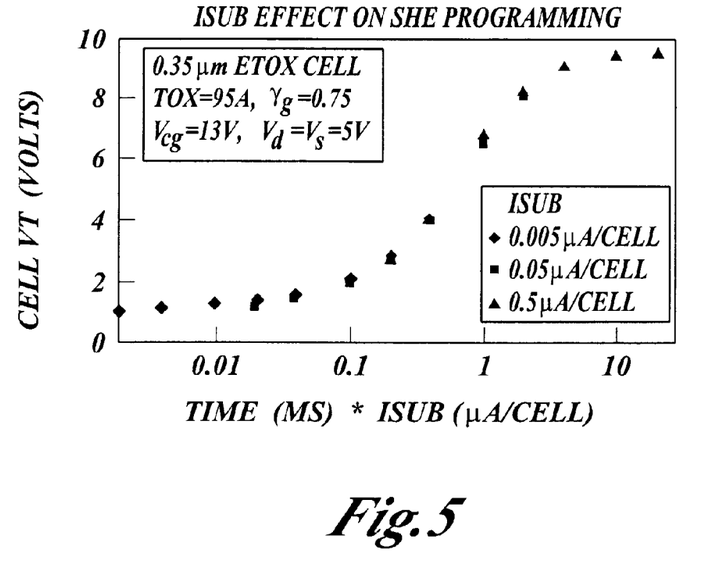
FIG. 5 is a graph is a universal programming curve for the programming method of the present invention.

Experimental programming curves on the ETOX cell of the present invention have been obtained. The programming speed is related to the magnitude of $I_{sub}$ (for providing seed electrons), the bias of $V_d$ and $V_s$ (for heating up electrons), and the $V_{cg}$ (for channel inversion and assisting hot electrons to inject across the tunnel oxide). FIG. 5 shows a universal program curve at constant $V_{cg}$, $V_d$, and $V_s$ with $I_{sub}$ * time as a parameter. The cell $V_t$ saturates for long programming times. Compared to channel hot electron methods, the total SHE programming current is reduced by ~100×.

Figure 6:
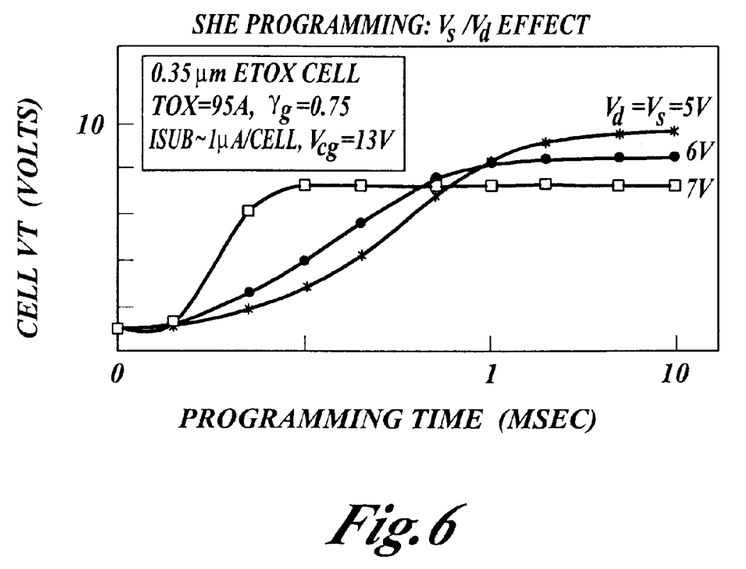
FIG. 6 is a graph showing the self convergence of $V_t$ for the programming method of the present invention.
Figure 7:
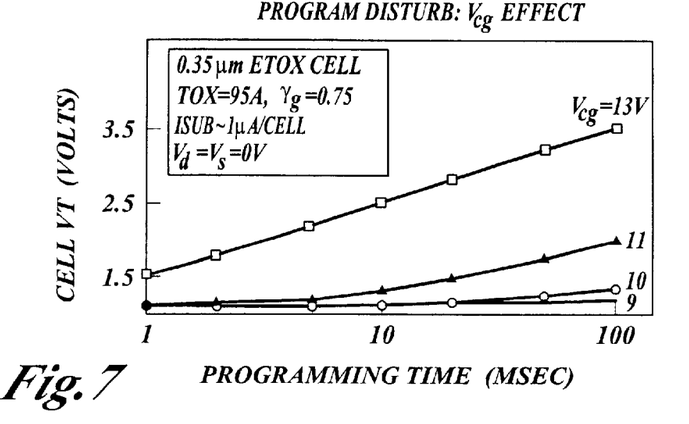
FIG. 7 is a graph of the program disturb characteristics for the programming method of the present invention.
Figure 8:
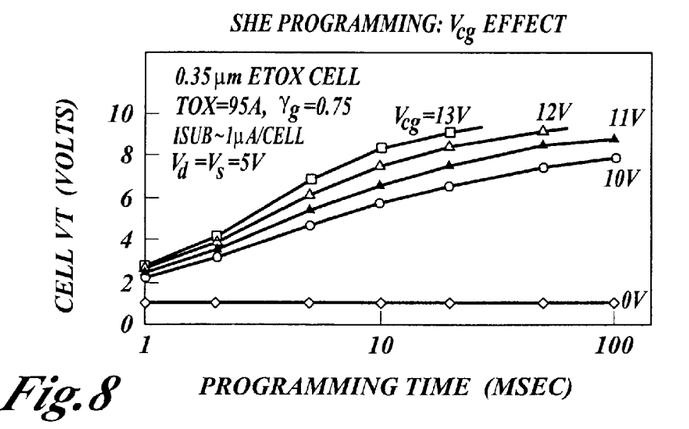
FIG. 8 is a graph is a programming curve at a constant bias with $V_{cg}$ as a parameter for the programming method of the present invention.

FIG. 6 demonstrates the self-convergence of SHE programming, where higher $V_d$ or $V_s$ results in faster programming and cell $V_T$ saturation to a lower level as predicted by Eq. (4). FIG. 7 shows program disturb characteristics with $V_{cg}$ as a parameter. The $V_{cg}$ during programming needs to be carefully selected to avoid program disturb by F-N tunneling. FIG. 8 shows SHE programming curves at constant bias of $V_d$, ($V_s$), and $I_{sub}$ with $V_{cg}$ as a parameter. Program disturb at $V_{cg}$=0 v is negligible.

Figure 9:
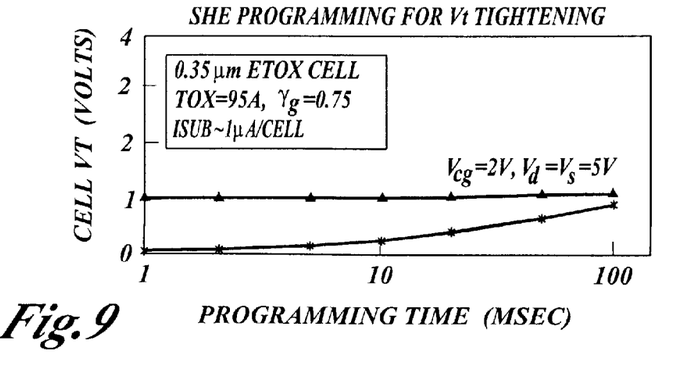
FIG. 9 is a graph showing effective tightening of $V_t$ after erase for the programming method of the present invention.

As noted above with respect to the prior art, the ETOX cell can be erased by F-N tunneling through either the source- side or the channel area. One serious problem is the wide $V_t$ spread after erase and the "tail-bits" for over-erase problems. See T. C. Ong, A. Fazio, N. Mielke, S. Pan, N. Righos, G. Atwood, S. Lai "Erratic Erase in ETOX Flash Memory Array", Paper 7A-2, Proceedings of VLSI Technology 1993. The tail-bits are those "weaker" bits which are erased faster abnormally than others by possibly local thinner oxide or latent defects. There are well known techniques for tightening the $V_t$ spread after erase by reprogramming using CHE (see S. Yamada, et. al., "A Self-convergence Erase Scheme for a Simple Stacked Flash EEPROM," *Tech. Digest Intl.* Electron Devices Meetings, p. 307, 1991) or F-N tunneling (see K. Oyada, et al., "A Novel Erasing Technology for 3.3 v Flash Memory with 64 Mb Capacity and Beyond," *Tech. Digest Intl.* Electron Devices Meetings, pp. 607–610, 1992). The present invention is also an effective technique for tightening $V_t$ after erase as demonstrated in FIG. 9.

In accordance with a further aspect of the present invention, the injection of electrons from the deep n-well to p-well junction can be improved. If the deep n-well dopant concentration is made higher than the p-well, then the electron injection can be significantly enhanced. Unfortunately, this is impossible when the deep n-well is formed by the conventional dopant implant and drive-in method. In an alternative embodiment, the deep n-well is formed by a high energy implant (e.g. implant high energy P31 by using an MeV implanter) so that the n-type dopants in the deep n-well are distributed in a retrograding manner. This can improve the electron injection efficiency from the deep n-well and can improve the SHE programming speed significantly.

The read operation of the ETOX cell with triple-well is the same as conventional ETOX cell.

Figure 10:
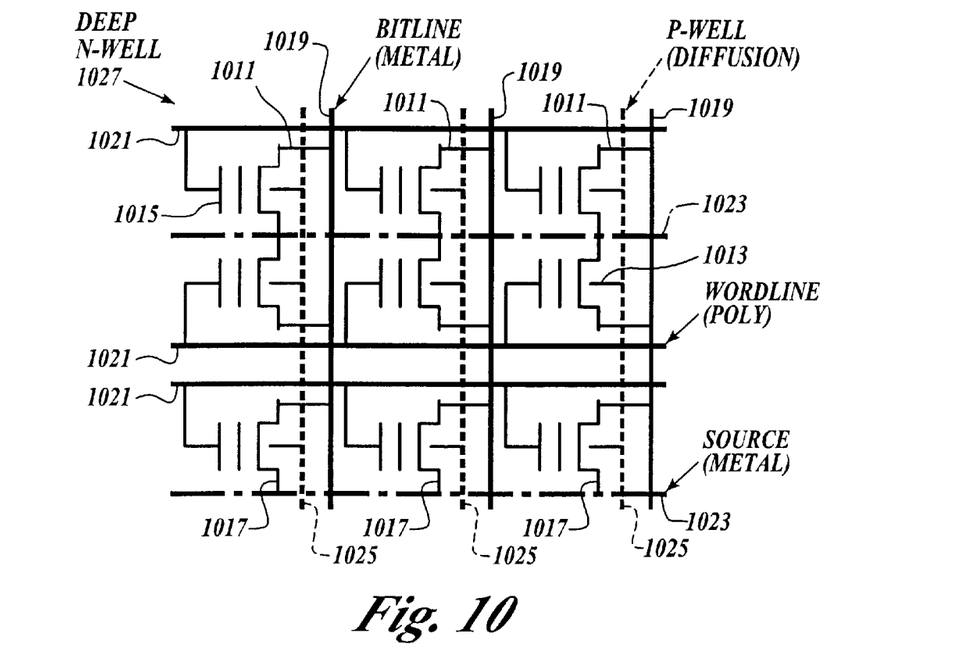
FIG. 10 is a schematic diagram of a NOR array architecture formed in accordance with the present invention.

The ETOX cells described above can be used in a novel NOR array architecture as shown in FIG. 10. Each ETOX cell is accessible to its drain 1011 (column), p-well 1013 (column), control gate 1015 (row) and source 1017 (row). The drain 1011 is connected to a column bitline 1019 through a contact and a metal line. The control gate 1015 is connected to a row wordline 1021 through polysilicon or a polycide gate material. The source 1017 is connected to a row source line 1023 by a contact and metal line. A pair of two rows of cells share a common row source line 1023. Each column of cells share one p-well 1025 (referred to as a p-well bias line) that can be biased separately from adjacent p-wells 1025 in adjacent columns. The entire array is set in a large, deep n-well 1027.

Figure 11:
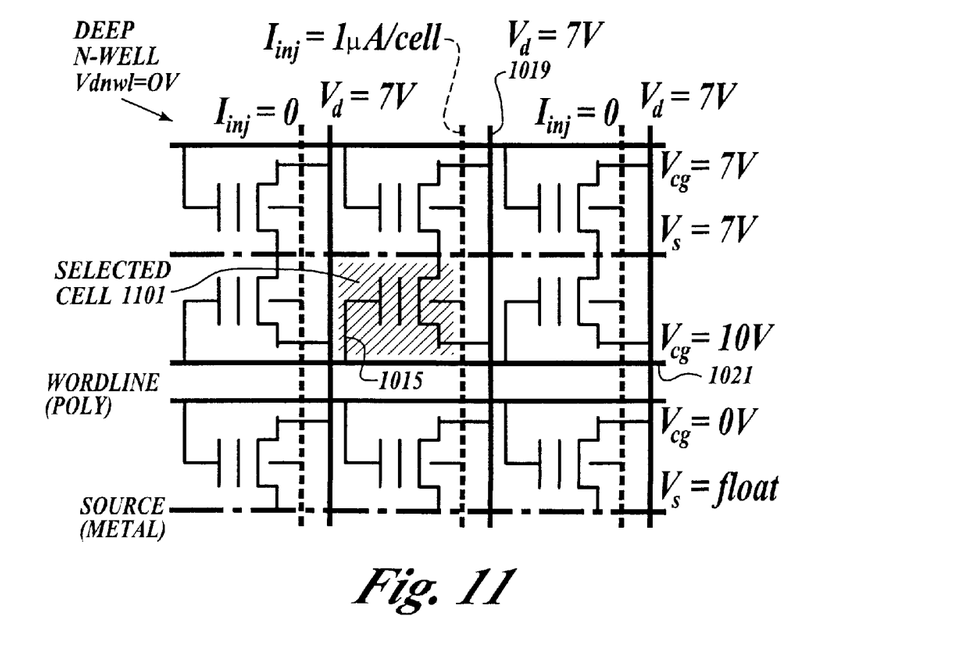
FIG. 11 is a schematic diagram of the NOR array architecture of FIG. 10 undergoing single bit programming.

The NOR array of FIG. 10 allows single bit programming by substrate hot-electron injection as shown in FIG. 11. All of the bit lines 1019 and source lines 1023 are biased to 7 volts. Further, the p-well 1025 of the selected ETOX cell 1101 is forward biased with respect to the deep n-well 1027 for injecting current (about 1 microamp/cell). The deep n-well 1027 is biased at 0 v preferably. Finally, the selected row wordline 1021 of the control gate 1015 of the selected ETOX cell 1101 is biased high (for example 10 v). All unselected cells suffer negligible program disturb. Although only one selected cell is to be programmed, the select column p-well 1025 still injects the total amount of current for programming an entire column of cells. Thus, it would be more efficient to program an entire column simultaneously as described below.

Figure 12:
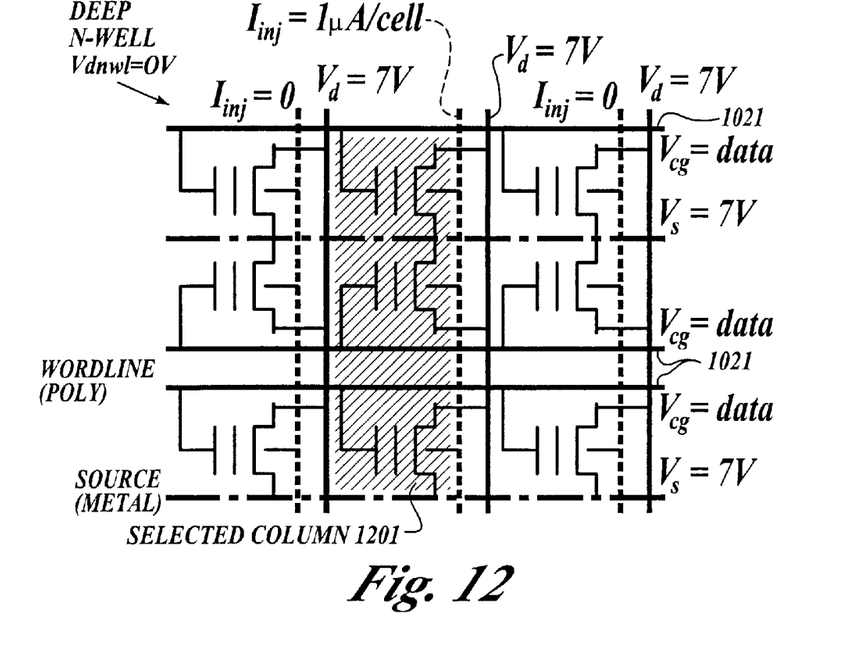
FIG. 12 is a schematic diagram of the NOR array architecture of FIG. 10 undergoing column programming.

The new NOR array of FIG. 10 also allows programming of all cells in one column simultaneously by substrate hot-electron injection as shown in FIG. 12. All of the bit lines 1019 and source lines 1023 are biased to 7 volts. Further, the p-well 1025 of the selected ETOX column 1201 is forward biased with respect to the deep n-well 1027 for injecting current (about 1 microamp/cell). The deep n-well 1027 is biased at 0 v preferably. The selected row wordlines 1021 of the control gates 1015 of the selected column 1201 are biased high or low (for example either 10 v or 0 v) representing the digital data of 1 or 0. All unselected cells in unselected columns suffer negligible program disturb.

Figure 13:
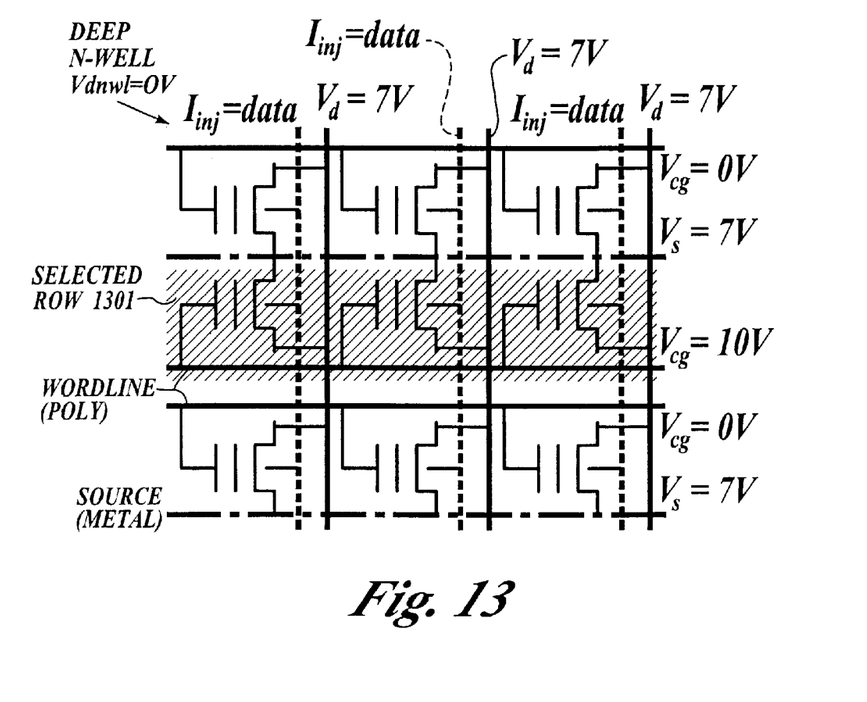
FIG. 13 is a schematic diagram of the NOR array architecture of FIG. 10 undergoing row programming.

The new NOR array of FIG. 10 also allows programming of all cells in a row simultaneously by substrate hot-electron injection as shown in FIG. 13. All of the bit lines 1019 and source lines 1023 are biased to 7 volts. The selected row wordline 1021 of the selected row 1301 is biased to 10 volts. The deep n-well 1027 is biased at 0 v preferably. The p-well 1025 of each ETOX cell is forward biased or at 0 v representing digital data 1 or 0, respectively. All unselected cells in unselected rows suffer negligible program disturb with their control gates biased at 0 v.

Figure 14:
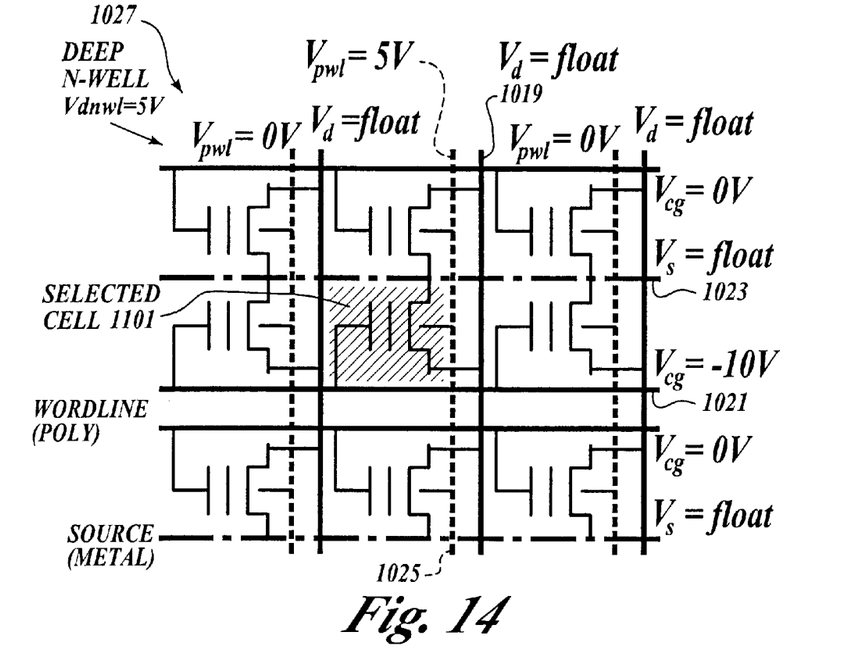
FIG. 14 is a schematic diagram of the NOR array architecture of FIG. 10 undergoing single bit erase.

The new NOR array of FIG. 10 also allows single bit erase using Fowler-Nordheim tunneling through the channel area as shown in FIG. 14. The selected p-well 1025 is biased high enough (approx. 5V) and the selected column bit line 1019 of the desired drain 1011 of the selected ETOX cell 1101 is left floating (clamped by the p-well bias to approx. 5V). The deep n-well 1027 is biased to 5V. The selected row wordline 1021 of the control gate 1015 of the selected ETOX cell 1101 is at a large negative bias (for example –10 v). The source line 1023 of the source 1017 of the selected ETOX cell 1101 is left floating. All unselected cells suffer negligible program disturb.

Figure 16:
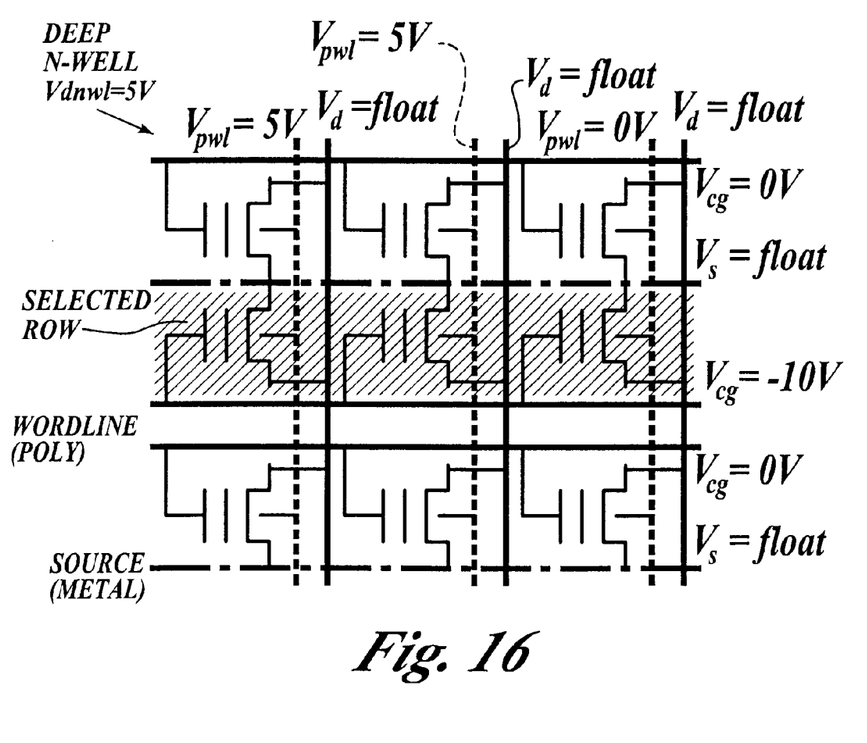
FIG. 16 is a schematic diagram of the NOR array architecture of FIG. 10 undergoing row erase.

The new NOR array of FIG. 10 also allows erase of all cells in a row simultaneously by Fowler-Nordheim tunneling as shown in FIG. 16. All biases are the same as in the single-bit erase described above, except that in addition, all of the p-wells 1025 are biased to 5V.

Figure 15:
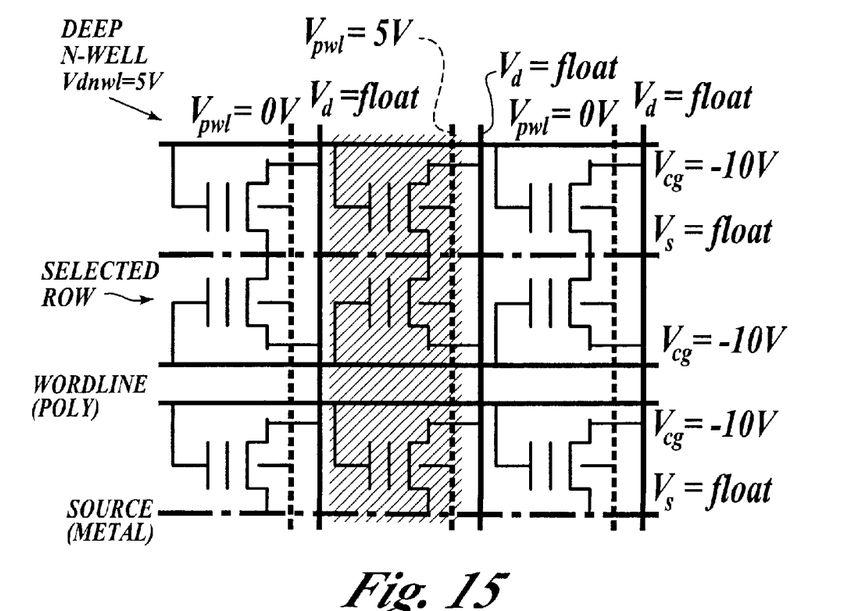
FIG. 15 is a schematic diagram of the NOR array architecture of FIG. 10 undergoing column erase.

Similarly, the new NOR array of FIG. 10 also allows erase of all cells in a column simultaneously by Fowler-Nordheim tunneling as shown in FIG. 15. All biases are the same as in the single-bit erase described above, except that in addition, all of the row wordlines 1021 are biased to –10V. Finally, entire blocks of rows or columns can be erased by biasing multiple row wordlines 1021 to –10V and biasing multiple p-wells 1025 to 5V.

Therefore, the new NOR array of ETOX cells in triple-well with individual p-wells can result in operations of full EEPROM as well as flash memory.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A NOR array architecture allowing single bit, row, and column programming and erase operations, said NOR array architecture comprising:
 a plurality of ETOX cells formed in a deep n-well, each of said ETOX cell having:
  (1) a control gate;
  (2) a floating gate insulated from and formed substantially underneath said control gate;
  (3) a p-well in said n-well and underneath said floating gate and said control gate;
  (4) a drain implant formed in said p-well adjacent to said floating gate; and
  (5) a source implant formed in said p-well adjacent to said floating gate;
 wherein said ETOX cells are formed into a two-dimensional array including a plurality of rows and a plurality of columns;
 further wherein each of said control gates of said ETOX cells sharing a common row are connected to a row wordline;

further wherein each of said source implants of said ETOX cells sharing a common row are connected to a row sourceline;

further wherein each of said drain implants of said ETOX cells sharing a common column are connected to a column bitline; and further wherein each of said p-wells of said ETOX cells in a common column are connected together to a common p-well bias line.

2. The array of claim 1 wherein said deep n-well is grounded.

3. The array of claim 1 wherein a selected ETOX cell is programmed by:

forward biasing said p-well bias line for said selected ETOX well relative to said deep p-well;

positively biasing said row wordline for said selected ETOX cell by a voltage sufficient to invert the channel between said source implant and said drain implant; and positively biasing said row source line and said column bitline for said selected ETOX cell.

4. The array of claim 1 wherein a selected column of ETOX cells are programmed by:

forward biasing said p-well bias line for said selected column of ETOX cells relative to said deep n-well;

positively biasing said row sourceline and said column bitline for said selected column of ETOX cells;

for programming a logical "1" to a selected ETOX cell in said selected column of ETOX cells, positively biasing said row wordline for said selected ETOX cell by a voltage sufficient to invert the channel between said source implant and said drain implant; and for programming a logical "0" to a selected ETOX cell in said selected column of ETOX cells, not biasing said row wordline for said selected ETOX cell by a voltage sufficient to invert the channel between said source implant and said drain implant.

5. The array of claim 1 wherein a selected row of ETOX cells are programmed by:

positively biasing said row wordline for said selected row of ETOX cells by a voltage sufficient to invert the channel between said source implant and said drain implant;

positively biasing said row sourceline for said selected row of ETOX cells;

positively biasing all of said column bitlines;

for programming a logical "1" to a selected ETOX cell in said selected row of ETOX cells, forward biasing said p-well bias line for said selected ETOX cell relative to said deep n-well; and for programming a logical "0" to a selected ETOX cell in said selected row of ETOX cells, not biasing said p-well bias line for said selected ETOX cell relative to said deep n-well.

6. The array of claim 1 wherein a selected ETOX cell is erased by:

forward biasing said p-well bias line for said selected cell;

grounding all of said p-well bias lines not forward biased;

forward biasing said deep n-well;

negatively biasing said wordline for said selected ETOX cell by a voltage sufficient to initiate Fowler-Nordheim tunneling; and grounding all of said row wordlines not negatively biased.

7. The array of claim 6 wherein said row sourcelines and said column bitlines are left floating.

8. The array of claim 1 wherein a selected column of ETOX cells are erased by;

forward biasing said p-well bias line for said selected column of ETOX cell;

grounding all of said p-well bias lines not forward biased;

forward biasing said deep n-well; and negatively biasing all of said row wordlines by voltage sufficient to initiate Fowler-Nordheim tunneling.

9. The array of claim 8 wherein said row sourcelines and said column bitlines are left floating.

10. The array of claim 1 wherein a selected row of ETOX cells are erased by:

forward biasing all of said p-well bias lines;

forward biasing said n-well;

negatively biasing row wordline for said selected row of ETOX cells by a voltage sufficient to initiate Fowler-Nordheim tunneling; and grounding all of said row wordlines not negatively biased.

11. The array of claim 10 wherein said row sourcelines and said column bitlines are left floating.

* * * * *